United States Patent
Yun

(10) Patent No.: US 7,701,294 B1
(45) Date of Patent: Apr. 20, 2010

(54) APPARATUS AND METHOD FOR NEGATIVE BOOST AUDIO AMPLIFIER

(75) Inventor: Yeong Ryong Yun, Incheon (KR)

(73) Assignee: National Semiconductor Corporation, Santa Clara, CA (US)

( * ) Notice: Subject to any disclaimer, the term of this patent is extended or adjusted under 35 U.S.C. 154(b) by 37 days.

(21) Appl. No.: 12/131,677

(22) Filed: Jun. 2, 2008

(51) Int. Cl.
*H03F 3/04* (2006.01)
(52) U.S. Cl. ..................................... 330/297
(58) Field of Classification Search ................ 330/127, 330/297; 327/536, 537
See application file for complete search history.

(56) References Cited

U.S. PATENT DOCUMENTS

| | | | |
|---|---|---|---|
| 6,636,104 | B2 | 10/2003 | Henry |
| 6,922,097 | B2 | 7/2005 | Chan et al. |
| 7,382,195 | B2 * | 6/2008 | Chen et al. ............. 330/297 |
| 7,554,408 | B2 * | 6/2009 | Chen et al. ............. 330/297 |
| 2003/0138112 | A1 | 7/2003 | Doy |
| 2005/0024962 | A1 | 2/2005 | Chan et al. |
| 2007/0159557 | A1 | 7/2007 | Nakakita et al. |

OTHER PUBLICATIONS

MAX1673, Maxim: Regulated, 125mA-Output Charge-Pump DC-DC Inverter, Maxim Integrated Products, USA, Jan. 1998, 8 pgs.
LM4911, "Stereo 40mW Low Noise Headphone Amplifier with Selectable Capacitive Coupled or OCL Output," National Semiconductor Corporation, Feb. 2003, 22 pgs.
LM4920, "Ground-Referenced, Ultra Low Noise, Fixed Gain, 80mW Stereo Headphone Amplifier," National Semiconductor Corporation, Oct. 2006, 17 pgs.
LM4922, "Ground-Referenced, Ultra Low Noise, Fixed Gain, 80mW Stereo Headphone Amplifier," National Semiconductor Corporation, Oct. 2006, 21 pgs.
LM4926, "Ground-Referenced, Ultra Low Noise, Fixed Gain, 80mW Stereo Headphone Amplifier," National Semiconductor Corporation, Jun. 2005, 22 pgs.
LM4923, "Boomer Audio Power Amplifier Series: 1.1 Watt Fully Differential Audio Power Amplifier with Shutdown Select," National Semiconductor Corporation, Dec. 2007, 14 pgs.
US Appl. No. 11/751,502, filed May 21, 2007.
A German Search Report, date Apr. 24, 2009, which issued during the prosecution of German Application No. 102008024520.8, 4 pages.
Official Communication for U.S. Appl. No. 11/751,502 mailed on Oct. 20, 2008.

* cited by examiner

*Primary Examiner*—Khanh V Nguyen
(74) *Attorney, Agent, or Firm*—Darby & Darby P.C.; Matthew M. Gaffney

(57) ABSTRACT

An audio amplifier with a negative DC/DC converter is provided. The audio amplifier receives VDD and VEE as power supply signals. The negative DC/DC converter is arranged to provide VEE from VDD, such that VEE is a negative voltage that is lower in magnitude than VDD. Accordingly, the power loss can be minimal with lower Vee, even though the audio power is increased. The audio amplifier further receives an audio input signal, and a reference voltage that is the arithmetic mean of VDD and VEE.

17 Claims, 6 Drawing Sheets

US 7,701,294 B1

APPARATUS AND METHOD FOR NEGATIVE BOOST AUDIO AMPLIFIER

FIELD OF THE INVENTION

The invention is related to power converters, and in particular but not exclusively, to a audio amplifier with a negative DC/DC converter that provides VEE for an audio amplifier such that VEE is a negative voltage that is lesser in magnitude that VDD, to provide the appropriate headroom voltage.

BACKGROUND OF THE INVENTION

An audio amplifier is a power amplifier that may be used to amplify low-power audio signals (e.g. 20 Hz-20 KHz signals) for driving a speaker load. The speaker load value typically varies from 4 ohm to 32 ohm. Audio amplifiers may be used to drive loudspeakers, but may also be used for driving other types of speaker loads such as audio headphones and earpieces. Traditionally, audio amplifiers are class AB amplifiers. However, other types of amplifiers, such as class D amplifiers, may also be employed.

BRIEF DESCRIPTION OF THE DRAWINGS

Non-limiting and non-exhaustive embodiments of the present invention are described with reference to the following drawings, in which.

DETAILED DESCRIPTION

Figure 1:
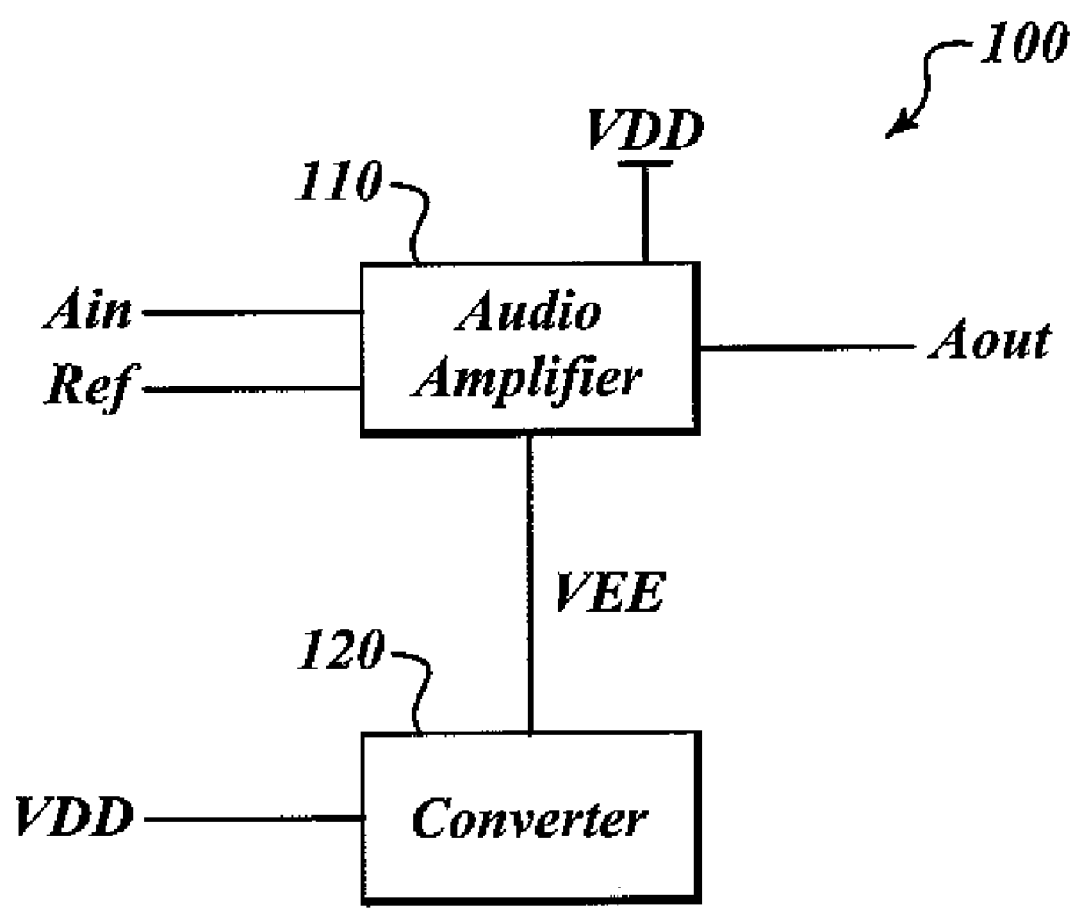
FIG. 1 shows a block diagram of an embodiment of a circuit including an audio amplifier and a converter.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to an audio amplifier with a negative DC/DC converter. The audio amplifier receives VDD and VEE as power supply signals. The negative DC/DC converter is arranged to provide VEE from VDD, such that VEE is a negative voltage that is lower in magnitude than VDD. The audio amplifier further receives an audio input signal, and a reference voltage that is the arithmetic mean of VDD and VEE.

FIG. 1 shows a block diagram of an embodiment of circuit 100. Circuit 100 includes converter 120 and audio amplifier 110. Audio amplifier 110 is arranged to receive audio amplifier input signal Ain, to receive reference voltage Ref, and to provide audio amplifier output signal Aout for driving a speaker load (not shown in FIG. 1). Signal Ain is based, at least in part, on an audio input signal. In one embodiment, signals Ain and Aout are both single-ended signals. In other embodiments, one or both of signals Ain and Aout are differential signals.

Audio amplifier 110 is arranged to receive positive power supply signal VDD as an upper power supply input and negative power supply signal VEE as a lower power supply input. Converter 120 is arranged to provide voltage VEE from voltage VDD such that the polarity of VEE is the opposite of the polarity of VDD (e.g. VEE is negative while VDD is positive). For example, in embodiment, VDD is 3.3V and VEE is −1.5V. In other embodiments, other values of VDD and VEE may be employed. In some embodiments, VEE is adjustable. In one embodiment, converter 120 is an inverting DC-DC power converter.

Reference voltage Ref is substantially equal to (VDD+VEE)/2. That is, reference voltage Ref is substantially the arithmetic mean of VDD and VEE. By using Ref=(VDD+VEE)/2 instead of ground, it is possible to avoid clipping that might otherwise cause poor sound quality.

Figure 2A:
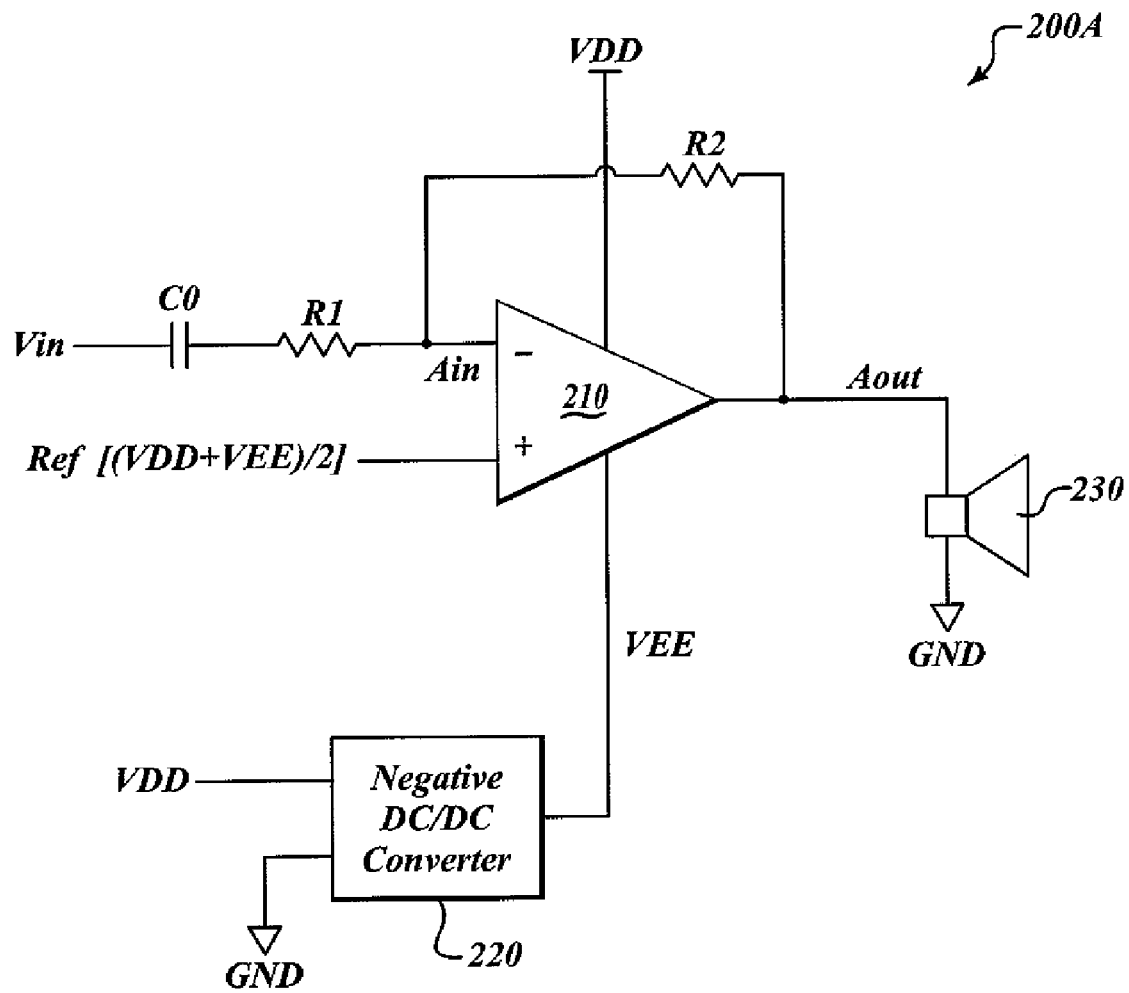
FIG. 2A illustrates a block diagram of an embodiment of the circuit of FIG. 1.

FIG. 2A illustrates a block diagram of an embodiment circuit 200, which may be employed as an embodiment of circuit 100 of FIG. 1. Negative DC/DC converter 220 is an embodiment of converter 120 of FIG. 1. In the embodiment shown, circuit 200 further includes capacitor C0, resistors R1 and R2, and speaker load 230.

Audio amplifier 210 has an inverting input that is arranged to receive audio amplifier input signal Ain, a noninverting input coupled to reference voltage Ref, a positive power supply input that is arranged to receive voltage VDD, a negative power supply input that is arranged to receive signal VEE, and an output that is arranged to provide audio amplifier output signal Aout. Audio amplifier signal Ain is based on audio signal Vin (which is the input audio signal to be amplified).

Although FIG. 2 illustrates a single-ended configuration embodiment of circuit 200, in other embodiments, other configurations may be employed, such as a bridge-tied load (BTL) configuration, or the like.

Figure 2B:
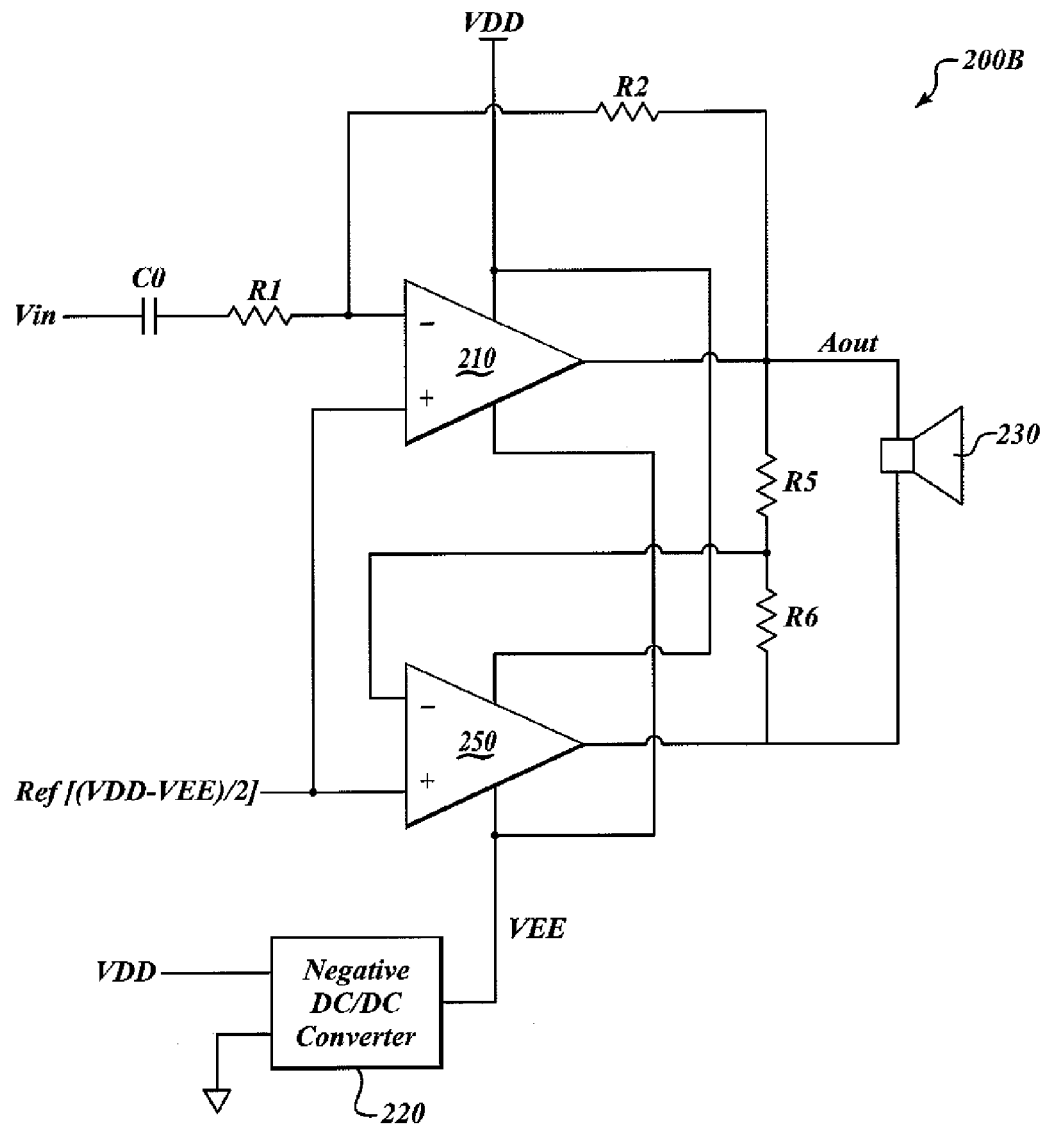
FIG. 2B illustrates a block diagram of a an embodiment of the circuit of FIG. 2A

FIG. 2B illustrates a block diagram of an embodiment of circuit 200B, which is a BTL configuration embodiment of circuit 200 of FIG. 2A. FIG. 2B further includes audio amplifier 250, resistor R5, and resistor R6.

Figure 3:
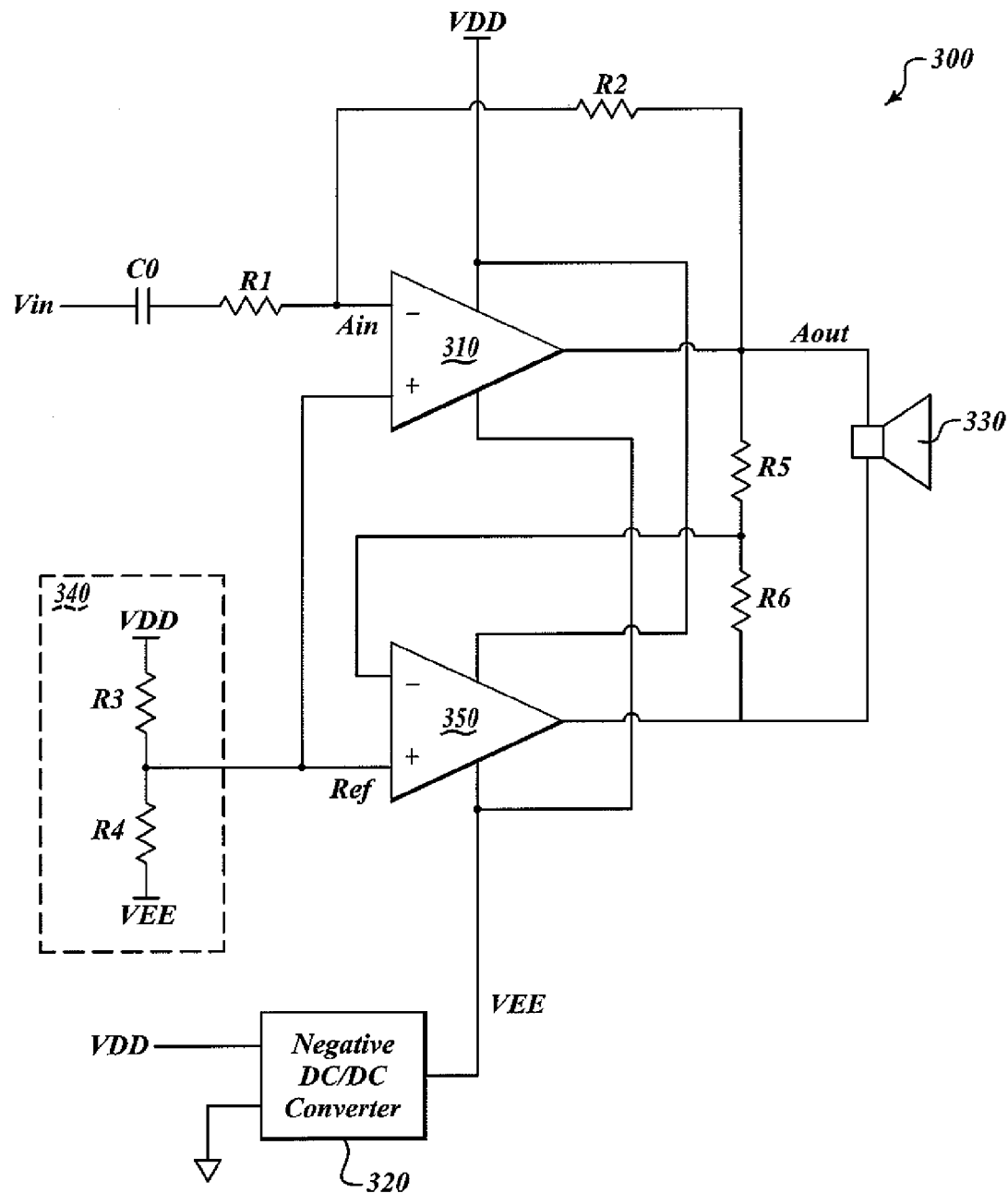
FIG. 3 shows a block diagram of an embodiment of the circuit of FIG. 2B.

FIG. 3 shows a block diagram of an embodiment of circuit 300, which may be employed as an embodiment of circuit 200B of FIG. 2B. Circuit 300 further includes voltage divider 340. Voltage divider 340 includes resistor R3 and resistor R4. Resistor R4 has substantially the same resistance as resistor R3. For example, in one embodiment, resistor R3 is a 50 KOhm resistor, and resistor R4 is a 50 KOhm resistor.

Figure 4:
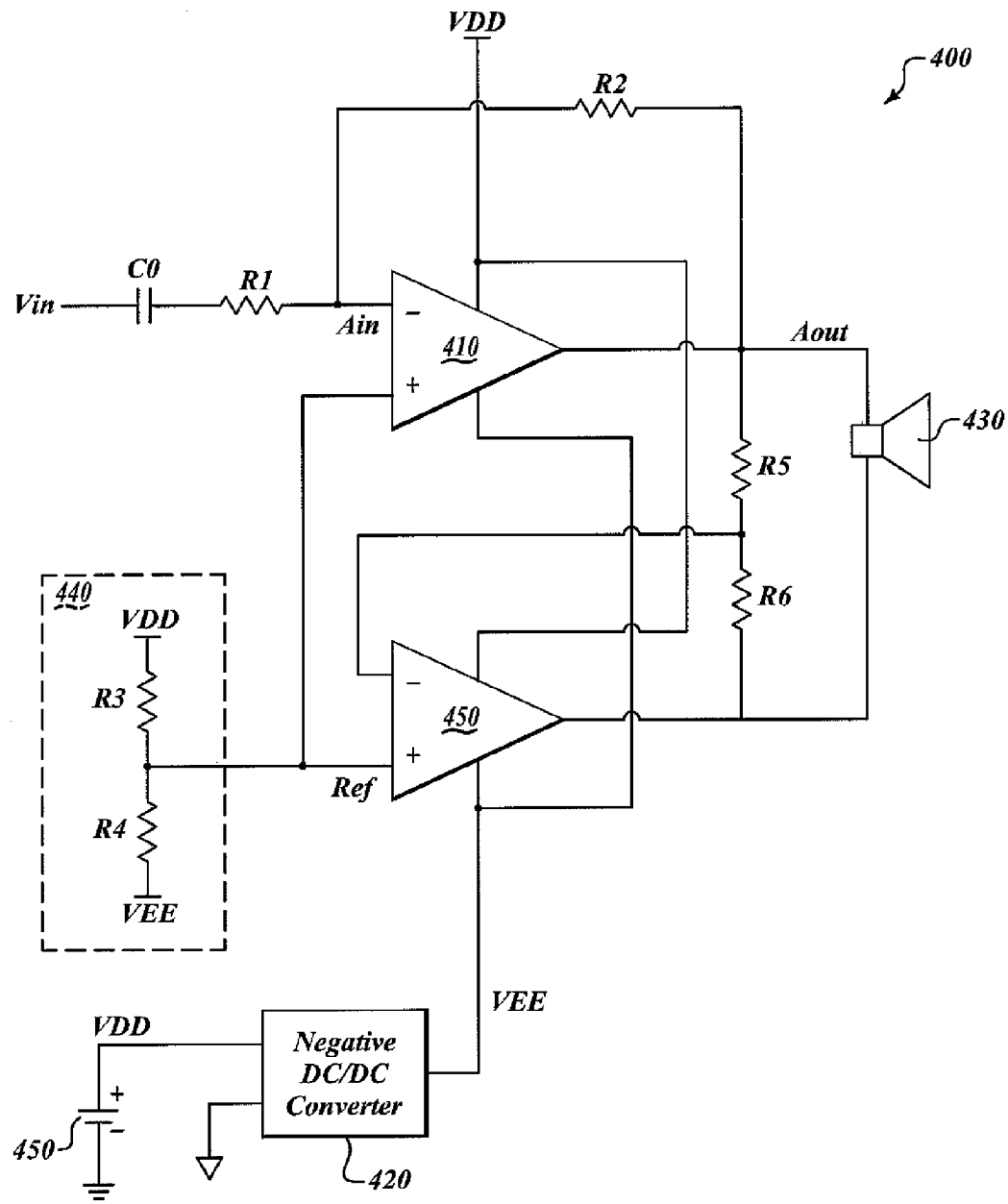
FIG. 4 illustrates a block diagram of an embodiment of the circuit of FIG. 3.

FIG. 4 shows a block diagram of an embodiment of circuit 400, which may be employed as an embodiment of circuit 300 of FIG. 3. Circuit 400 further includes battery 450, which is used to provide voltage VDD.

An embodiment of circuit 400 may be used in a portable handheld device having a power level that is usable up to 2.5V or 2.8V. When battery 450 is fully charged, negative DC/DC converter 420 need not be used. However, when the battery voltage (VDD) less than 3.3V, voltage VDD need not be boosted. Instead, negative converter 420 is enabled to increase the total headroom VDD-VEE available to the portable handheld device. Using negative DC/DC converter 420 doubles the user's battery time in one embodiment. In one embodiment, VEE is adjustable according to how discharged battery 450 is, so that the necessary amount of headroom is provided to audio amplifier 410.

In some embodiments, use of VEE may be desirable even if battery 450 is fully charged. For example, in one embodiment, battery 450 operates at 3.8V, and a maximum power of about 600 mW-700 mW would be achieved even negative DC/DC converter 420 were not used. However, by employing DC/DC converter 420 and providing −1.5V at VEE, 1W of power can be achieved with lower battery voltage conditions, such as 3V or less than 3V.

Figure 5:
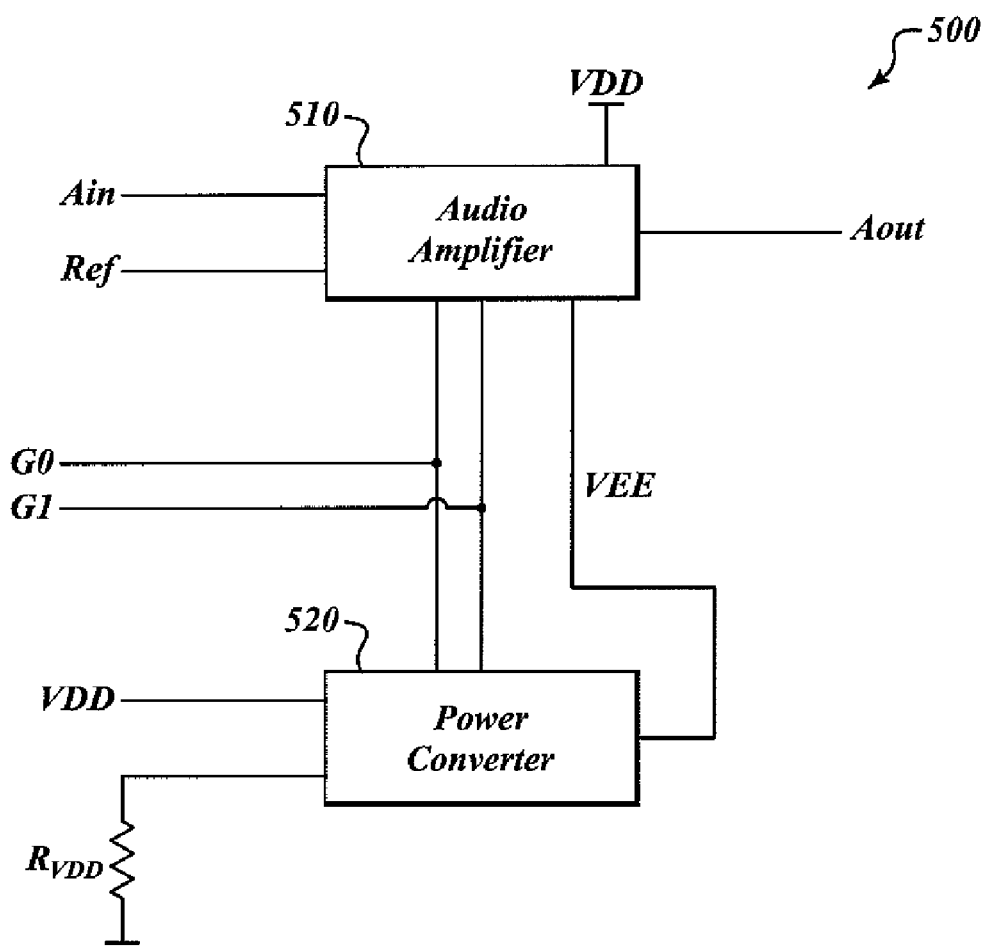
FIG. 5 shows a block diagram of an embodiment of the circuit of FIG. 1, arranged in accordance with aspects of the present invention.

FIG. 5 illustrates an embodiment of circuit 500, which may be employed as an embodiment of circuit 100 of FIG. 1. FIG. 5 and Table 1 illustrate the example of correlation between the Vee voltage control and audio gain/battery condition.

In one embodiment, the audio gain is adjustable, and power converter 520 is enabled/disabled based on the battery voltage and audio gain. In various embodiments, audio gain and power converter 520 can be controlled by serial or parallel control port, or the like. Further, the vdd reference can be set by an additional resistor, external control signal also, and/or the like (as shown by optional resistor Rvdd in FIG. 5).

In one embodiment, the correlation is as follows. If the battery (e.g. battery 450 of FIG. 4) is over 3.5V, Vee is not required until the audio gain is 12 dB. Accordingly, in one embodiment, if the battery voltage is greater than 3.5V and the audio gain is less than 12 dB, power converter 520 is disabled so that Vee is not provided. However, if the battery voltage is less than 3.5V, Vee is required for 12 dB gain.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for audio amplification, comprising:
an audio amplifier having at least a first input, a second input, a VDD input, a VEE input, and an output, wherein the audio amplifier is arranged to receive an audio signal at the first input of the audio amplifier, to receive a reference voltage at the second input of the audio amplifier such that the reference voltage is the arithmetic mean of a first power supply voltage and a negative supply voltage, to receive the first power supply voltage at the VDD input, and to drive a speaker load at the output of the audio amplifier; and a converter having at least: an output that is coupled to the VEE input of the audio amplifier, and an input, wherein the converter is arranged to receive the first power supply voltage at the input of the converter, and to provide the negative supply voltage at the output of the converter such that the negative supply voltage has the opposite polarity of the first power supply voltage and a lesser magnitude than the first power supply voltage.

2. The circuit of claim 1, wherein the converter is arranged to provide the negative supply voltage such that the negative supply voltage is regulated to a voltage level that is adjustable.

3. The circuit of claim 2, wherein the converter is arranged such that the negative supply voltage is regulated to a voltage level that is adjustable based on a battery voltage and a gain of the audio amplifier.

4. The circuit of claim 1, wherein the converter is an inverting DC-DC voltage converter.

5. The circuit of claim 1, wherein the audio amplifier is arranged to drive an audio speaker load, a headphone speaker load, or an earpiece speaker load.

6. The circuit of claim 1, wherein the audio amplifier is arranged to drive an audio headphone speaker load or an earpiece speaker load.

7. The circuit of claim 1, further comprising a voltage divider that is arranged to provide the reference voltage from the first power supply voltage and the negative supply voltage.

8. The circuit of claim 1, wherein the first power supply voltage is a battery voltage.

9. A circuit for audio amplification, comprising:
an audio amplifier having at least a first input, a second input, a VDD input, a VEE input, and an output, wherein the audio amplifier is arranged to receive an audio signal at the first input of the audio amplifier, to receive a voltage divider output voltage at the second input of the audio amplifier, to receive a first power supply voltage at the VDD input, and to drive a speaker load at the output of the audio amplifier;

a converter having at least: an output that is coupled to the VEE input of the audio amplifier, and an input, wherein the converter is arranged to receive the first power supply voltage at the input of the converter, and to provide a negative supply voltage at the output of the converter such that the negative supply voltage has the opposite polarity of the first power supply voltage and a lesser magnitude than the first power supply voltage; and a voltage divider that is arranged to provide a reference voltage from the first power supply voltage and the negative power supply voltage.

10. The circuit of claim 9, wherein
the voltage divider includes:
a first resistor that is coupled between the VDD input of the audio amplifier and the second input of the audio amplifier, wherein the first resistor has a first resistance; and
a second resistor that is coupled between the second input of the audio amplifier and the VEE input of the audio amplifier, wherein the second resistor has a second resistance that is substantially equal to the first resistance.

11. The circuit of claim 9, wherein the first power supply voltage is a battery voltage.

12. A method for audio amplification, comprising:

converting a positive power supply signal into a negative power supply signal such that the negative power supply signal is opposite in polarity to the positive power supply signal and lesser in magnitude than the positive power supply signal;

providing the positive power supply signal as a positive power supply for an audio amplifier;

providing the negative power supply signal as a negative power supply for the audio amplifier;

providing a reference voltage to the audio amplifier such that the reference voltage is substantially equal to the arithmetic mean of the positive power supply signal and the negative power supply signal.

13. The method of claim 12, wherein converting the positive power supply signal into the negative power supply signal includes regulating the negative power supply signal to a regulated voltage level that is adjustable.

14. The method of claim 12, wherein providing the reference voltage is accomplished with a voltage divider.

15. The method of claim 12, wherein providing the positive power supply signal is accomplished with a battery such that the positive power supply voltage is the battery voltage.

16. The method of claim 15, wherein the negative power supply signal is adjustable.

17. The method of claim 16, wherein the negative power supply signal is adjusted based on the battery voltage and a gain of the audio amplifier.

* * * * *

UNITED STATES PATENT AND TRADEMARK OFFICE
CERTIFICATE OF CORRECTION

PATENT NO.        : 7,701,294 B1
APPLICATION NO. : 12/131677
DATED             : April 20, 2010
INVENTOR(S)       : Yeong Ryong Yun It is certified that error appears in the above-identified patent and that said Letters Patent is hereby corrected as shown below:

Title page column 2, line 36, under Abstract insert -- VEE --
In column 1, line 34, after "2A" insert -- ; --
In column 3, line 37, insert -- VEE --
In column 3, line 46, insert -- VEE --
In column 3, line 50, insert -- VEE --
In column 3, line 51, insert -- VEE --
In column 3, line 42, insert -- VDD --
In column 3, line 44, insert -- $R_{VDD}$ --
In column 4, line 20, insert -- DC/DC --
In column 2, line 41, insert -- DC/DC --

Signed and Sealed this

Seventh Day of December, 2010

David J. Kappos
*Director of the United States Patent and Trademark Office*